United States Patent [19]

Sanderson

[11] 4,015,218

[45] Mar. 29, 1977

[54] TEMPERATURE COMPENSATED SOLID-STATE OSCILLATOR

[75] Inventor: Albert E. Sanderson, Carlisle, Mass.

[73] Assignee: Inventronics, Inc., Carlisle, Mass.

[22] Filed: Apr. 10, 1975

[21] Appl. No.: 566,840

Related U.S. Application Data

[63] Continuation-in-part of Ser. No. 467,210, May 6, 1974, abandoned.

[52] U.S. Cl. .............................. 331/111; 323/22 T; 331/176; 331/186
[51] Int. Cl.² ...................................... H03K 3/353
[58] Field of Search ................ 323/16, 22 R, 22 T; 331/111, 186, 185, 176

[56] References Cited

UNITED STATES PATENTS

| | | | |
|---|---|---|---|
| 3,074,028 | 1/1963 | Mammano | 331/111 |
| 3,114,114 | 12/1963 | Atherton et al. | 331/111 |
| 3,173,107 | 3/1965 | Scharf et al. | 331/111 |
| 3,202,937 | 8/1965 | Anderson | 331/111 |
| 3,320,551 | 5/1967 | Miller | 331/176 |
| 3,380,000 | 4/1968 | Morrison | 331/176 |
| 3,388,344 | 6/1968 | West | 331/176 |
| 3,526,853 | 9/1970 | Vittoz | 331/176 |
| 3,573,506 | 4/1971 | Morris | 331/176 |
| 3,735,276 | 4/1972 | Apolant | 331/113 R |
| 3,809,928 | 5/1974 | Evans | 307/310 |

OTHER PUBLICATIONS

Electronic Circuits Manual, Markus 1971, p. 645.
EEE, vol. 16, No. 12, Dec., 1968 "Designing Power Supplies with FETs" by Henry Wu.

*Primary Examiner*—John Kominski
*Attorney, Agent, or Firm*—Cesari and McKenna

[57] ABSTRACT

Temperature-compensated solid-state oscillators. A temperature sensitive voltage regulator provides to the oscillator a supply voltage which varies in accordance with a temperature-dependent voltage across a diode junction in the oscillator timing circuit. The oscillator frequency thereby remains substantially constant over a wide range of ambient temperatures and input voltages.

16 Claims, 3 Drawing Figures

TEMPERATURE COMPENSATED SOLID-STATE OSCILLATOR

CROSS REFERENCE TO RELATED APPLICATION

This application is a continuation-in-part of patent application Ser. No. 467,210 filed May 6, 1974 and now abandoned and assigned to the same assignee as the present invention.

BACKGROUND OF THE INVENTION

This invention relates to oscillator circuits and, more specifically, to oscillator circuits of the type which contain a diode in a timing circuit that controls the oscillator frequency.

One type of relaxation oscillator adapted to use this invention generally comprises a unijunction transistor, a timing circuit and a voltage source. The unijunction transistor has an emitter electrode and base 1 and 2 electrodes. Generally, the voltage source connects across the base electrodes. The timing circuit comprises a resistor and capacitor in series. The resistor connects between the power supply and the emitter electrode while the capacitor connects in parallel with the emitter and base 1 electrodes. The unijunction transistor may be any type of unijunction transistor. When the voltage of the capacitor exceeds a peak voltage, the unijunction transistor discharges the capacitor through the emitter-base junction which is a diode.

Another oscillator circuit of this type is a free running multivibrator. The free running oscillator comprises first and second switching transistors which conduct alternately thereby to control the charging and discharging of timing capacitors in a timing circuit that includes the base-emitter junctions of the transistors. Again, these junctions constitute diode junctions in the timing circuit.

Oscillators of this type are not suitable with respect to temperature variations, and the frequency of the oscillator can vary significantly with temperature variations. This terminal instability is due almost entirely to the temperature sensitivity of the voltage across these diodes in the timing circuits.

In the prior art, compensation for the unijunction transistor oscillator is generally provided by inserting a temperature compensating resistor in series with the base 2 electrode. The value of this compensating resistor is based on the intrinsic standoff ratio of the unijunction transistor and the value of the interbase resistance. This use of a compensating resistor is based on the fact that the inter-base resistance ($R_{BB}$) between the base terminals of the unijunction transistor increases with temperature at approximately 0.8% per ° C. The compensating resistor is selected so that as $R_{BB}$ varies, the base-to-base voltage, $V_{BB}$, also varies. The term $\eta V_{BB}$ then varies and approximately compensates for changes in voltage across the diode junction.

With this compensation, frequency variations can be maintained to ±1% over a range from −20° C to +70° C. If this variation in frequency is not acceptable, the prior art suggests that the compensating resistor be adjusted for a minimum variation under cyclical heating and cooling by using a temperature chamber. These operations are extremely time consuming and add expense to the oscillator circuit.

Furthermore, the compensation results are valid only for one given frequency. If the frequency changes, the required value for the compensating resistor also changes. Thus, these prior techniques do not compensate a variable-frequency oscillator incorporating unijunction transistors.

Various temperature compensation schemes for free-running multivibrators also appear in the prior art. In all of these a differential voltage source is inserted in the timing circuit while the power supply voltage is held constant. Typical differential voltage sources include a transistor coupled to the base-emitter junction of one multivibrator transistor, a voltage generator comprising a diode circuit coupled to the collectors of the multivibrator transistors and circuitry for supplying a compensating voltage to the base electrodes of the multivibrator transistors.

Thus, all the temperature compensation circuits for relaxation and free running multivibrator oscillators have common characteristics. First, the supply voltage is held constant and isolated from the active element (i.e., the unijunction transistor or the multivibrator transistors) in the timing circuit. Secondly, a source of an approximate compensating voltage is superimposed on normal timing circuit signals. Although these temperature compensation techniques tend to reduce frequency variations due to temperature changes, the variations still remain to a significant degree. In one of the multivibrator examples, a variation of over 100 parts per million per degree Celsius still exists.

Therefore, it is an object of this invention to provide a solid-state oscillator which produces a stable output frequency over a wide range of temperatures and input voltages.

Another object of this invention is to provide a temperature compensation circuit for solid-state oscillators which is relatively inexpensive.

Still another object of this invention is to provide a unijunction transistor relaxation oscillator which produces a stable output frequency over a wide range of temperatures and input voltages.

Yet another object of this invention is to provide unijunction relaxation oscillator which produces a stable output frequency over a wide range of frequencies.

Yet still another object of this invention is to provide a free-running multivibrator oscillator which produces a stable output frequency over a wide range of temperatures and input voltages.

SUMMARY OF THE INVENTION

In accordance with this invention, a supply voltage from a power supply for an oscillator is varied in accordance with variations in the voltage across a diode junction in the oscillator in response to temperature changes. This supply voltage variation compensates the variation of the diode voltage. As a result, the oscillator frequency is stable over a wide range of temperatures.

This invention is pointed out with particularity in the appended claims. A more thorough understanding of the above and further objects of this invention may be attained by referring to the following description taken in conjunction with the accompanying drawings.

DESCRIPTION OF AN ILLUSTRATIVE EMBODIMENT

In accordance with this invention, I have found that solid-state oscillators which include a diode junction can be temperature compensated by allowing the supply voltage to the oscillator to vary with temperature. This is distinguished over the prior art circuits wherein the supply voltage is held at a substantially constant level. In accordance with my invention, there is no isolation between the timing circuits in the oscillator and the power supply as constrasted with the prior art. Variations in the voltage across a diode junction, comprising the emitter-to-base junction in a semiconductor switching means in a unijunction transistor or the base-emitter junction in a multivibrator transistor, are fully compensated. As a result, the oscillator has superior frequency stability with respect to temperature and input voltage variations. In fact, stabilities of ten parts per million per degree Celsius and less are achieved in a battery-operated oscillator. Also, stabilities of ten parts per million per volt and less are achieved when the input voltage varies from six to ten volts.

Figure 1:
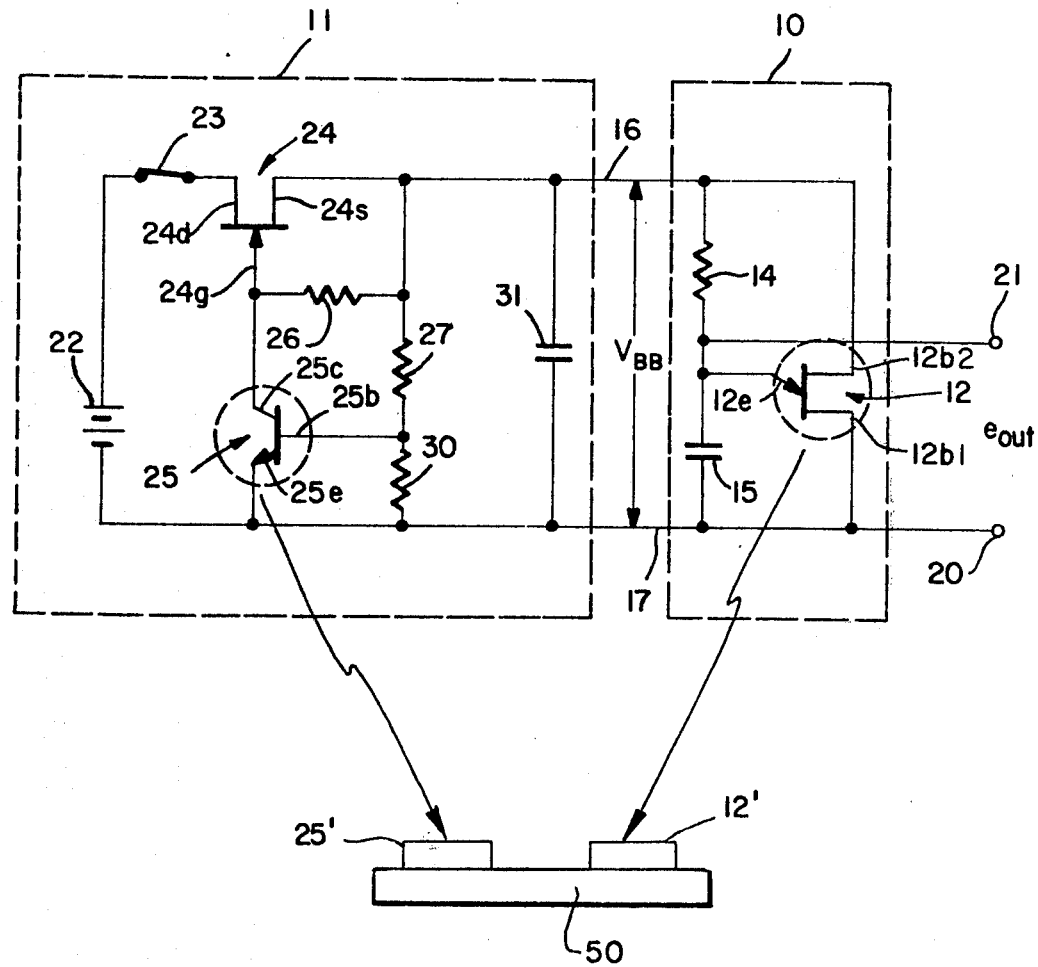
FIG. 1 is a schematic diagram of a unijunction transistor oscillator constructed in accordance with this invention.

In FIG. 1, an oscillator network comprises a relaxation oscillator 10 which responds to a supply voltage from a regulated power supply 11. The oscillator 10 comprises a unijunction transistor (UJT) 12 with a base 1 electrode 12b1 as a common terminal, a base 2 electrode 12b2 as a power input terminal and an emitter electrode 12e as a control input terminal. A timing circuit comprising resistor 14 and capacitor 15 also connects to the unijunction transistor 12. Specifically, an input conductor 16 from the regulated power supply 11 connects to the base 2 electrode 12b2 and the timing resistor 14. A common input conductor 17 from the regulated power supply 11 connects to the capacitor 15 so the base emitter diode junction is forward biased and the base 1 electrode 12b1. The emitter electorde 12e connects to the junction of the resistor 14 and capacitor 15.

As known, when a voltage $V_{BB}$ is applied to conductors 16 and 17 in FIG. 1, the capacitor 15 charges through the resistor 14 until the voltage between the base 1 electrode 12b1; and the emitter electrode 12e reaches a peak-point voltage value at which the junction diode that these two electrodes form becomes forward biased and the capacitor 15 discharges. As soon as the capacitor 15 discharges to the valley voltage, it begins recharging. The oscillator circuit 10 thus produces a signal with a given frequency which is dependent upon the timing circuit. In this particular oscillator, an output voltage ($e_{out}$) is taken from a terminal 20 connected to the common conductor 17 and a terminal 21 connected to the emitter electrode 12e. In this configuration, the output voltage E essentially has a sawtooth waveform.

As known, the frequency (fo) of the oscillator 10 is:

$$\frac{1}{f_o} = RC \ln[(V_{BB} - V_V) / (V_{BB} - V_p)] \quad (1)$$

where

R is the value of the resistor 14;

C is the value of the capacitor 15;

$V_{BB}$ is the supply voltage between wires 16 and 17;

$V_V$ is the "valley" or turn-off voltage of the transistor 12; and $V_p$ is the "peak-point" or turn-on voltage of the transistor 12.

The resistor 14 and capacitor 15 are selected so that their values are constant with temperature. In prior art oscillators, the power supply 11 provides a constant supply voltage, unaffected by temperature variations. The peak voltage ($V_p$) and valley voltage ($V_V$) are given by:

$$V_P = \eta V_{BB} + V_D \quad (2)$$

$$V_V = V_R + V_D \quad (3)$$

where:

$\eta$ is the intrinsic stand-off ratio of the unijunction transistor 12;

$V_D$ is the voltage across the diode in the emitter-base 1 path in the unijunction transistor 12, and $V_R$ is the voltage across the resistance in the emitter-to-base 1 path of the unijunction transistor 12, while the latter is heavily conducting, during the switching interval.

The quantity $\eta$ is essentially constant over a wide range of ambient temperature, and $V_R$ is much less than $V_D$ in (3). $V_D$ however, decreases with temperature at the rate of approximately 3mV/° C. Consequently, $V_P$ and $V_V$ also change with temperature at this rate. With a decrease in $V_P$, the peak point voltage, the frequency of the oscillator correspondingly increases. A decrease in $V_V$, the valley point voltage, causes the frequency to decrease, but at a much slower rate.

In accordance with this invention, the supply voltage $V_{BB}$ is caused to vary with temperature. Specifically, the voltage $V_{BB}$ varies in accordance with variations in $V_D$. Thus, if $V_{BB}$ is allowed to vary linearly as $V_D$ so $$V_{bb} = a V_D \quad (4)$$

where $a$ is a constant, then equation (1) can be rewritten as $$1/f_o = RC \ln[(a-1)/(a-\eta a-1)] \quad (5)$$

In accordance with equation (5) all the terms are constants or insensitive to temperature variations. As a result, the oscillator stability is compensated over a wide range of temperatures. Also, no frequency dependent terms exist in equation (5) so the compensation is effective over a wide range of temperatures and resonant frequencies.

FIG. 1 also shows a regulated power supply which produces an output voltage on wires 16 and 17 variable in accordance with this invention. This power supply 11 includes, by way of example, a battery 22. The positive voltage is coupled through switch 23 to an N-channel depletion mode field effect transistor 24 that acts as a variable conduction means. A drain electrode 24d that acts as an input terminal and connects to the switch 23 while the output conductor 16 connects to a source electrode 24s that acts as an output terminal. A gate electrode 24g that acts as a central terminal is coupled to the other output conductor 17 by an NPN transistor 25. Specifically, a collector electrode 25c is connected to the gate electrode 24g and a collector resistor 26 couples both electrodes to the output conductor 16. Conductivity through the field effect transistor 24 thus is controlled by the voltage produced at the collector 25c of the NPN transistor 25 which, in turn, is controlled by a voltage divider comprising a resistor 27 and a resistor 30. The resistor 27 couples a base electrode 25b to the output conductor 16; the resistor 30, to the common output conductor 17. A capacitor 31 tends to minimize the effect of any ripple in $V_{BB}$ caused by the oscillator 10.

In operation, the base-emitter junction in the NPN transistor 25 is a reference element. The voltage across that junction, $V_{be}$, determines the supply voltage $V_{BB}$. Specifically, $$V_{BB} = V_{be}(R_{27} + R_{30})/R_{30} \qquad (6)$$

If the output voltage $V_{BB}$ were to increase, the current through resistor 27 would increase also. This current increase would increase the collector current through the transistor 25 and the voltage across the resistor 26. Then the source-to-gate voltage (i.e., the voltage at the gate electrode 24g with respect to that at the source electrode 24s) would become more negative and decrease the conductivity through the field effect transistor 24. As is thus apparent, regulator 11 provides the supply voltage $V_{BB}$ which is largely independent of input voltage variations and load current variations.

However, the voltage $V_{BB}$ is responsive to ambient temperature changes. Specifically, the base-to-emitter voltage is the voltage across a diode junction formed, in FIG. 1, with the base electrode connected to the anode. As known, the current I, through a diode and the saturation current, $I_r$ through a diode are given by:

$$I = I_r [\exp(qV_D/kT) - 1] \qquad (7)$$

$$I_r = aT^3 \exp(E_g/kT) \qquad (8)$$

where $q$ is the charge on an electron;
$V_D$ is the voltage across the base-emitter junction;
$k$ is Boltzmann's constant;
$T$ is the temperature in degrees Kelvin;
$a$ is a constant; and
$E_g$ is the energy gap across the diode junction in ergs.
As the term $\exp(qV_D/kT)$ is much greater than 1, equation (7) can be written as:

$$I = I_r \exp(qV_D/kT) \qquad (9)$$

If equation (8) is substituted in equation (9) and the resulting equation is solved for $V_D$, then $$V_D = (E_g/q) - (3kT/q)\ln(T I/a) \qquad (10)$$

For a given diode energized by a constant current source, $$C1 = E_g/q \qquad (11)$$

$$C2 = 3k/q \qquad (12)$$

$$C3 = I/a \qquad (13)$$

so equation (10) has the form
$$V_D = C_1 - C_2 T \ln C_3 T \qquad (14)$$

The natural logarithm of the temperature varies relatively slowly, with respect to temperature, so in many applications equation (14) can be replaced by $$V_{be} = V_D \cong C_1 - C_2 T$$

Thus, the voltage $V_{BB}$ decreases as temperature increases and, as shown by equations (4) and (5), the frequency of the oscillator 10 does not change. In fact, an oscillator 10 and regulator 11 as shown in FIG. 1 has been tested over a frequency range of 27,778 Hz to 54,765 Hz. Over a temperature range from 10° C to 30° C, the temperature coefficient of frequency was found to be less than 12 ppm/° C. The total frequency change over this temperature range was less than ±0.01%.

In substituting equation (3) in equation (1), it was assumed that $V_R$ was negligible in comparison with $V_D$. The small variations in frequency that remain uncompensated lead me to believe that $V_R$ is also temperature dependent and is the source of the measured variation.

The reference junction in the transistor 25 and the unijunction transistor 12 are normally available as physically separate elements. In FIG. 1, a highly thermally conductive support 50 has mounted onto it the elements constituting the unijunction transistor (designated 12') and the transistor (designated 25'). With this arrangement, which can be implemented using conventional manufacturing techniques, both the transistor 25 and the unijunction transistor 12 stay at the same temperature. Therefore, either as the ambient temperature changes or as the transistors warm up, the voltages $V_{be}$ and $V_D$ change by the same amount and $V_{BB}$ changes proportionally as discussed above. If the units are not on such a common support 50, the compensation is still effective for variations in ambient temperatures.

Figure 2:
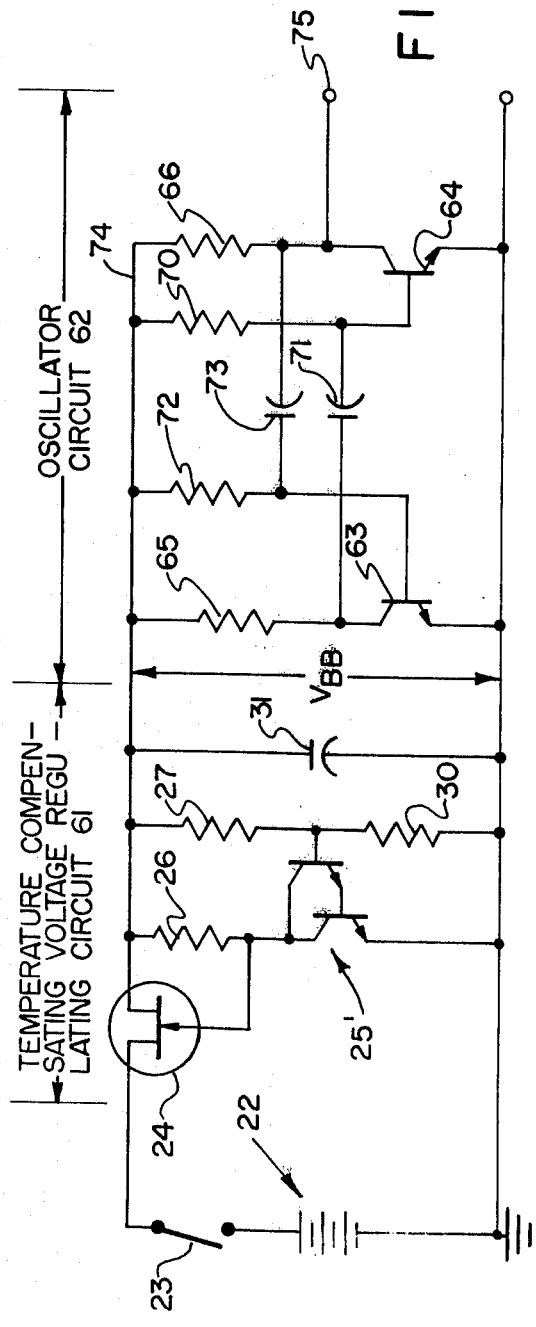
FIG. 2 is a schematic diagram of a free-running multivibrator constructed in accordance with this invention.

Now referring to FIG. 2, this invention can be applied to free-running multivibrator oscillators. As shown in FIG. 2, a temperature compensated oscillator network comprises a power source in the form of a battery 22 and switch 23, a temperature compensating voltage regulating circuit 61 and an oscillator circuit 62. The oscillator circuit 62 is a conventional free-running multivibrator circuit comprising transistors 63 and 64 connected in a grounded-emitter configuration with the collectors respectively being coupled to the circuit 61 by resistors 65 and 66. A first timing circuit, comprising a resistor 70 and capacitor 71, controls the conduction of the transistor 64 while a resistor 72 and capacitor 73 constitute a timing circuit which controls conduction through the transistor 63.

When the transistor 63 turns on, its collector shifts to a voltage, $V_{sat}$, which is the voltage across the collector and emitter electrodes when the transistor 63 is fully conducting. As the capacitor 71 is then fully charged, the base of the transistor 64 drops to a voltage $-(V_{BB}-V_D)$ where the voltage, $V_{BB}$, is the voltage on a conductor 74 and the voltage $V_D$, is the base-emitter voltage across the transistor 64 during conduction. In a typical circuit the voltage on the conductor 74 is $V_{BB} = 5$ volts and the diode voltage $V_D$ is about 0.5 volts. Thus, at the instant transistor 63 turns on, the base of the transistor 64 shifts to a voltage of about −4.5 volts, thereby turning off the transistor 64.

Then, the capacitor 71 begins to charge through the timing resistor 70 and the voltage at the base of the transistor 64 rises along the exponential curve until the voltage at the base is about 0.5 volts positive with respect to the emitter whereupon the transistor 64 turns on and quickly saturates, driving the output voltage at a terminal 75 to the collector saturation voltage, $V_{sat}$. As the capacitor 73 is then charged, it drives the base of the transistor 63 to the negative value (e.g., −4.5 volts).

Both the first and second timing circuits include the base-emitter junction of one of the multivibrator transistors 63 and 64. This is a diode junction. If the oscillator circuit 62 produces a pulse train with about a 50% duty cycle, the two timing circuits have the same time constants so that the values of the resistor 70(R70) and resistor 72(R72) are equal (e.g., R70=R72=R). Likewise, the values of the capacitor 71 and 73 are equal (e.g., C71=C73=C). The equation for the operating frequency of such an oscillator circuit 62 is:

$$1/fo = 2RC \ln[(2V_{BB}-V_D-V_{sat})/(V_{BB}-V_D)] \quad (16)$$

The saturation voltage, $V_{sat}$, is significantly less than the base-emitter junction voltage, $V_D$. Transistors with $V_{sat} = 0.020$ volts and $V_D = 0.50$ volts are common. Thus, the saturation voltage can be neglected. Assuming that, in accordance with this invention the supply voltage $V_{BB}$, varies as a function of the diode voltage $V_D$, so that $V_{BB} = aV_D$, where $a$ is a constant, equation (16) can be rewritten as $$1/fo = =2RC \ln[(2a-1)/(a-1)] \quad (17)$$

Thus, the resonant frequency is independent of temperature.

Of course, the saturtion voltage does have a small effect on thermal stability, but it is a linear effect. If the resistor 26 is changed, the resulting variation in the diode current alters the overall temperature coefficient in a linear manner. This adjustment thus compensates even for the variations with temperature in the saturation voltage and the impedance of the tuning resistors and capacitors.

The temperature compensating voltage-regulating circuit 61 in FIG. 2 provides the temperature dependent supply voltage. It is basically the same as the circuit shown in FIG. 1, so like numerals refer to like elements throughout. The regulating element is a field effect transistor 24 which is a series regulating element controlled by current through a resistor 26 between the source and gate electrodes. Transistors 25', in a Darlington configuration, control the conduction through the resistor 26 and are substituted for the single transistor 25 shown in FIG. 1. The resistors 27 and 30 and the capacitor 31 perform the same function as shown in FIG. 1 to thereby produce a supply voltage $V_{BB}$ which varies with temperature in proportion to the voltage across the two series diode junctions in the transistors 25'.

Figure 3:
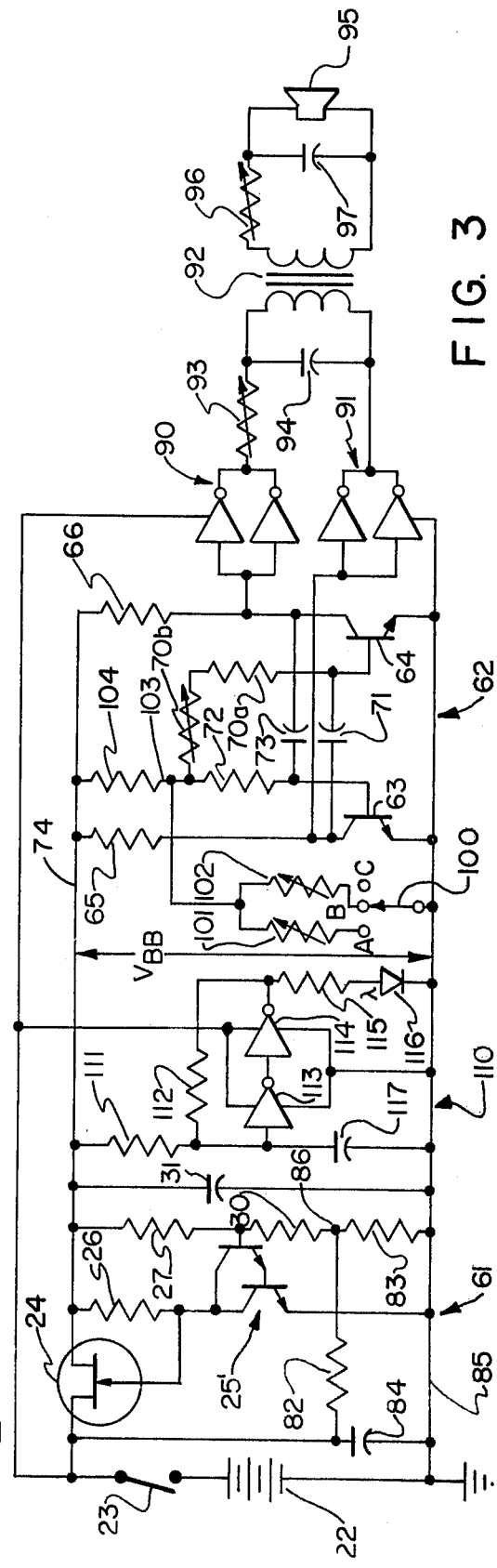
FIG. 3 is a schematic diagram of a generator for producing a number of audio tones using a free-running multivibrator shown in FIG. 2.

Thus, in the circuits in FIGS. 1 and 2, the supply voltage, $V_{BB}$, is constant over a wide range of input voltage but varies with temperature to thereby compensate the effects of the changing voltage across the diode junction of the oscillator timing circuit. FIG. 3 illustrates a portable reference tone generator which can produce three musical tones, namely, the tones of A, B and C which have frequencies of 440.00, 493.88 and 523.25 Hz, respectively, on an equally tempered scale. When a circuit element in FIG. 3 performs the same function as a circuit element in FIG. 2, it has a corresponding reference numeral. The battery 22 energizes the circuit when the switch 23 closes. The temperature compensating voltage-regulating circuit 61 comprises a field effect transistor 24, a pair 25' of transistors in a Darlington configuration, a resistor 26 and a voltage divider resistor 27 and 30. A capacitor 31 provides a smoothing function.

It is apparent that the battery 22 does not constitute a regulated power supply. A feed-forward circuit, comprising a resistor 82 and a resistor 83, improves the overall voltage regulation of the circuit 61. More specifically, the input voltage from the battery 22 appears across a capacitor 84 which the resistor 82 couples to a junction formed by inserting the resistor 83 in series between a ground conductor 85 and the resistor 30. The value of the resistor 83 is very small in comparison with the values of the resistors 27 and 30, but the value of the resistor 82 is very large in comparison with the values of the resistors 27 and 30. If the battery voltage decreases, the current component through the resistors 82 and 83 decreases thereby lowering the potential at a junction 86. This decreases conduction through the transistor pair 25' and increases conduction through the transistor 24 thereby preventing the normal normally encountered decrease in the supply voltage, $V_{BB}$, from a decrease in the input voltage from the battery 22. With this particular regulator configuration, the output voltage varies as little as 40 parts per million over an input voltage range from 6 to 10 volts. If additional regulation is necessary, a voltage regulator of the type generally shown in FIG. 1 of U.S. Pat. application Ser. No. 466,992, filed May 6, 1974, now U.S. Pat. No. 3,983,473 and entitled SERIES DIRECT CURRENT REGULATOR and assigned to the same assignee as the present invention can be inserted between the battery 22 and the temperature compensating voltage regulating circuit 61.

The multivibrator circuit for oscillator circuit 62 in FIG. 3 is substantially like the multivibrator circuit 62 in FIG. 2. It comprises switching transistors 63 and 64, collector resistors 65 and 66, a timing resistor 72, capacitors 71 and 73, and a fixed resistor 70a and a variable resistor 70b in series. The variable resistor 70b is a fine tuning adjustment for the oscillator.

Still referring to FIG. 3, the signals on the collector electrodes of the transistors 63 and 64 are push-pull signals which energize the inverter pairs 90 and 91, respectively. The inverter pairs drive a speaker transformer 92 through a volume control 93. A smoothing capacitor 94 is in parallel with the primary of the transformer 92. No transformer center tap is necessary because the inverters 90 and 91 produce outputs which are either at a positive or ground potential.

The secondary of the transformer 92 is coupled to a speaker 95 through a resistor 96. A capacitor 97, connected in parallel with the input terminals to a speaker 95, forms a low-pass filter circuit with resistor 96 and the speaker coil and produces a substantially sinusoidal output signal at the speaker 95.

The circuit shown in FIG. 3 can produce one of three separate tones by setting a three-position switch 100 in an offset circuit additionally comprising variable resistors 101 and 102. The circuit connects to a junction 103 formed by the variable resistor 70b, the timing resistor 72 and a resistor 104. When the switch is in its right-most position, the resistors 101 and 102 do not conduct, so the timing circuits in the oscillator 62 determine the frequency. When the resistor 101 or resistor 102 in in the circuit, it decreases the voltage at junction 103, so that the frequency also decreases. Thus, in the center and left-most positions the switch 100 selects one of the resistors 101 and 102 which are set to provide two different frequencies.

As the circuit in FIG. 3 is battery operated, it contains a battery warning circuit 110. This circuit comprises a voltage divider formed of resistors 111 and 112. The resistor 112 is in parallel with tandem inverters 113 and 114. A resistor 115 and a light-emitting diode 116 are connected to the output of the inverter 114 and a capacitor 117 couples the input of the inverter 113 to ground. The inverters 113 and 114 receive power directly from the battery 22. Thus, so long as the battery 22 produces an unregulated voltage which establishes a threshold at the input of the inverter 113 which is greater than that portion of the regulated voltage across the resistor 112, the inverter 113 sees a logical ZERO signal, and the output of the inverter 114 is at a ground potential so the lamp 116 does not light. As the battery voltage decreases, however, the established threshold eventually falls below the regulated voltage input to the inverter 113 whereupon the output of the inverter 114 shifts to a positive level and energizes the light emitting diode 116. The resistor 112 latches the input to the inverter 113 to a positive potential in this condition. The capacitor 117 maintains the input to the inverter 113 at a logical ZERO level when power is first applied thereby to initially disable the battery warning circuit 110 momentarily when the switch 23 closes.

By way of example, a multiple tone generator for use as an electronic tuning fork has been constructed as shown in FIG. 3 with the following components

| | | |
|---|---|---|
| Battery — 9 volts | Resistors 65,66 | — 43 kilohm |
| FET 24 —2N5486 | 70a | 137 kilohm |
| Transistors 25', 63, 64 — CA3018 | 70b | 1 kilohm |
| Inverters 90, 91, 113, 114 — CD4049 | 72 | 138 kilohm |
| Transformer 92 — 8 ohm | 82 | 1.5 megohm |
| speaker transformer | 83 | 1 kilohm |
| Capacitors 31, 84, 97 — 47 µFd, 10v. | 93 | 5 kilohm |
| 71, 73 0.01 µFd | 96 | 10 kilohm |
| 94, 117 — 0.1 µFd | 101 | 35.5 kilohm |
| Resistors 26 — 4.7 megohm | 102 | 14.6 kilohm |
| A7—478 kilohm | 104, 114 | 2.2 kilohm |
| 30 — 105 kilohm | 111, 113 | — 1 megohm |

This tuning fork produces the tones of "A" at 440 Hz and the successive "B" and "C" notes. Within the limits imposed by the sensitivity of measuring equipment, a total frequency change of only 127 parts per million has been observed over a 25° Celsius range (i.e., an average frequency stability of about 5 parts per million per degree Centigrade).

The transistors 25', 63 and 64 are on a common thermally conductive substrate in the CA 3018 package. The resistor 26 was selected by periodically touching the RCA CA 3018 package cover with a heated soldering gun until no frequency change on heating and cooling was observed. A decrease in frequency on heating was countered by decreasing the value of the resistor 26. Tests show that there is substantially no warm-up frequency drift within the limits of the measuring equipment. Although the tuning capacitors 71 and 73 and resistors 70a and 72 had known, non-zero linear temperature coefficients, the resistor 26 in FIG. 3 was altered to compensate this effect.

It will also be apparent that this circuit is very efficient. That is, the elements in the circuit 61, the oscillator 62 and the low battery circuit 110 require only small amounts of energy. Thus, the estimated life of a standard battery, measured until the light-emitting diode 116 turns on, should be about 50 hours or better.

The audio output stages 90 and 91 consume most of the power.

In summary, the oscillator 10 in FIG. 1 and the oscillators 62 in FIGS. 2 and 3 constitute basic oscillator circuits which are not themselves compensated for temperature variation. No added temperature compensating resistors or other sources of temperature dependent voltages are added. Rather, the circuit 11 in FIG. 1 and the circuit 61 in FIGS. 2 and 3 perform two functions which provide substantially stable output frequency from the oscillator over a wide range of temperature variations and input voltages. Thus, at a given temperature, the voltage $V_{BB}$ does not vary to any significant degree over a relatively wide range of input voltage variations. As a second function, the temperature compensating circuit varies the supply voltage, $V_{BB}$, in accordance with variations which occur in the voltage drop across the diode junctions in the oscillator timing circuits. These diode junctions are constituted by the emitter-base-one junction in the UJT 12 and by each base-emitter junction in the multivibrator transistors 63 and 64. The supply voltage variation compensates variations which would otherwise occur in the frequency of the oscillators over a wide range of temperatures. In fact, the frequency stability of the oscillator becomes primarily a function of the stability of the passive elements in the timing circuits, and even this instability can be compensated by the resistor 26.

There have been shown several specific embodiments of oscillators and temperature compensating circuits which embody this invention. Many variations are possible. For example, the frequency variation circuit comprising the switch 100 and variable resistors 101 and 102 can be modified by merely switching different values of resistors in place of the resistor 104 to effect various frequency changes. The input voltage from the battery instead may be derived from a conventional voltage regulator which produces a substantially constant output voltage over a range of input voltage variations and temperature variations. Further, a temperature-compensating voltage-regulating circuit such as the circuit 62 compensates any oscillator with a diode junction in a timing circuit. Thus, other specific oscillator embodiments can be substituted for the specifically disclosed oscillators. Therefore, it is the object of the appended claims to cover all such variations and modifications as come within the true spirit and scope of this invention.

What is claimed as new and desired to be secured by Letters Patent of the United States is:

1. A temperature stable oscillator network for connection to a power source for producing an alternating current output signal, said network comprising:

A. an oscillator circuit including:

i. semiconductor switching means having common terminal means for connection to the power source, power input terminal means, control input terminal means and diode junction means including a diode junction connected to said control input terminal means to be forward biased by a voltage thereat, and ii. timing means for controlling the frequency of oscillation produced by said switching means, said timing means being connected to said control input terminal means for controlling conduction through said diode junction means; and B. voltage regulator means including:

i. variable conduction means in series between the power source and said oscillator circuit and with input terminal means for connection to the power source, output terminal means connected to said timing means and to said power input terminal means thereby to apply a single voltage simultaneously to both said timing means and said switching means, and control terminal means, and ii. control means connected to said control and output terminal means for generating a control signal that varies proportionally with variations in the voltage across said diode junction means that are induced by temperature variations thereby to control the conductivity between said input and output terminal means of said variable conduction means and to vary the voltage that energizes both said timing means and said switching means proportionally as the voltage across said diode junction means, thereby to stabilize the frequency of the alternating current output signal from said oscillator network as a function of temperature.

2. A temperature stable oscillator network as recited in claim 1 wherein

A. said variable conduction means comprises a series regulating element, and

B. said control means comprises transistor means that is connected to said series regulating element and that includes a second, forward-biased diode junction means.

3. A temperature stable oscillator network as recited in claim 2 wherein said series regulating element comprises a field effect transistor.

4. A temperature stable oscillator network as recited in claim 2 wherein said first and second diode junction means are mounted on a common thermally conductive substrate.

5. A temperature stable oscillator network as recited in claim 2 additionally comprising output means connected to said oscillator circuit for receiving signals therefrom.

6. A temperature stable oscillator network as recited in claim 5 wherein said timing means cause said oscillator circuit to have a frequency in the audio frequency range, said output means including means for converting the signals from said oscillator circuit into audible form.

7. A temperature stable oscillator network as recited in claim 6 wherein the timing means in said oscillator circuit cause said oscillator to have a frequency which corresponds to the frequency of a musical note, said temperature stable oscillator network thereby producing a reference musical note when energized.

8. A temperature stable oscillator network as recited in claim 2 additionally comprising:

i. an indicator, ii. threshold means connected to said power source, to the output of said variable conduction means and to said indicator means to energize said indicator means when the voltage from said power source decreases below a predetermined level.

9. A temperature stable oscillator network as recited in claim 2 additionally comprising means in said oscillator circuit for varying the oscillator frequency.

10. A temperature stable oscillator network as recited in claim 2 wherein said transistor means comprises a transistor and said control means additionally comprises a voltage divider energized by said supply voltage and connected to a base electrode of said transistor.

11. A temperature stable oscillator network as recited in claim 2 wherein said transistor means comprises first and second transistors connected in a Darlington configuration and said control means additionally comprises a voltage divider energized by the supply voltage and connected to an input base electrode of said Darlington configuration of transistors.

12. A temperature stable oscillator network as recited in claim 2 wherein said control means comprises a voltage divider connected to the output of said series regulating element and to said transistor means, a first resistor in series with said voltage divider whereby said resistor and voltage divider are energized by the supply voltage, and a second resistor coupling said first resistor to said power source.

13. A temperature stable oscillator network as recited in claim 1 wherein

A. said semiconductor switching means in said oscillator circuit is a unijunction transistor and the first diode junction means is between said emitter and base-one electrodes, said timing means being connected to said base electrodes and said emitter electrode, and B. said voltage regulator means includes i. a series regulating element as said variable conduction means for producing, at the output thereof, a normally constant supply voltage for said oscillator circuit, and ii. transistor means in said control means connected to said series regulating element and that includes a second, forward biased, diode junction means, said second diode junction means being coupled to the output of said series regulating element.

14. A temperature stable oscillator network as recited in claim 13 wherein said first and second diode junction means are mounted on a common, thermally conductive substrate.

15. A temperature stable oscillator network as recited in claim 1 wherein

A. said oscillator circuit comprises a free running multivibrator with first and second timing circuits in said timing means and first and second switching transistors in said semiconductor switching means, the base-emitter junctions of said switching transistors as constituting said first diode junction means, and B. said voltage regulator means comprises:

i. a series regulating element as said variable conduction means, for producing, at the output thereof, a normally constant supply voltage for said oscillator circuit, and ii. transistor means in said control means connected to said series regulating element and that includes a second diode junction means, said base-emitter junction being coupled to the output from said series regulating element.

16. A temperature stable oscillator network as recited in claim 15 wherein said first and second diode junction means are mounted on a common thermally conductive substrate.

* * * * *

UNITED STATES PATENT OFFICE
CERTIFICATE OF CORRECTION

Patent No. 4,015,218      Dated March 29, 1977

Inventor(s) Albert E. Sanderson      Page 1 of 2

It is certified that error appears in the above-identified patent and that said Letters Patent are hereby corrected as shown below:

Column 1, line 38, delete "suitable" and insert --stable--
          line 41, delete "terminal" and insert --thermal--
Column 3, line 15, delete "constrasted" and insert --contrasted-
          line 16, after "," insert --in a semiconductor switching means--
          line 17, delete "in a semiconductor"
          line 18, delete "switching means"
          line 40, delete the line and insert --and--
          line 41, delete "electorde" and insert --electrode--
          line 43, after "15" insert --so the base-emitter diode junction is forward biased--
          line 47, delete the semicolon ";"
Column 4, line 60, delete "and"
          line 63, delete "central" and insert --control--
Column 5, in equasion 11, delete "C1" and insert --$C_1$-- and delete "9" and insert --q--
          in equasion 12, delete "C2" and insert --$C_2$-- and delete "9" and insert --q--
          in equasion 13, delete "C3" and insert --$C_3$--
          in equasion 15, delete "$C_2$" and insert --$C^3$-- and after that equasion insert --(15)--
Column 7, line 11, delete "C71=C73-C" and insert --C71=C73=C--
          in equasion 17, delete "= =" and insert -- = --
          line 29, delete "saturtion" and insert --saturation--

UNITED STATES PATENT OFFICE
CERTIFICATE OF CORRECTION

Patent No. 4,015,218  Dated March 29, 1977

Inventor(s) Albert E. Sanderson  Page 2 of 2

It is certified that error appears in the above-identified patent and that said Letters Patent are hereby corrected as shown below:

Column 8, line 19, delete "normal"
 line 64, delete "in" (first occurrence) and insert --is--
In the table of Column 9
 delete "A7" and insert --27--
 dashes (--) should be added to separate each component designation from its value for capacitors 71, 73 and for resistors 70a through 114.

Signed and Sealed this thirtieth Day of August 1977

[SEAL]

Attest:

RUTH C. MASON
Attesting Officer

C. MARSHALL DANN
Commissioner of Patents and Trademarks